US009269497B2

(12) United States Patent  (10) Patent No.: US 9,269,497 B2
Morris  (45) Date of Patent: Feb. 23, 2016

(54) INTEGRATED CAPACITIVELY-COUPLED BIAS CIRCUIT FOR RF MEMS SWITCHES

(71) Applicant: Raytheon Company, Waltham, MA (US)

(72) Inventor: Francis J. Morris, Dallas, TX (US)

(73) Assignee: RAYTHEON COMPANY, Waltham, MA (US)

( * ) Notice: Subject to any disclaimer, the term of this patent is extended or adjusted under 35 U.S.C. 154(b) by 57 days.

(21) Appl. No.: 14/292,598

(22) Filed: May 30, 2014

(65) Prior Publication Data

US 2015/0348714 A1  Dec. 3, 2015

(51) Int. Cl.
| H01G 5/16 | (2006.01) |
| H01H 59/00 | (2006.01) |
| H01L 29/92 | (2006.01) |
| H01L 49/02 | (2006.01) |
| H01L 29/66 | (2006.01) |

(52) U.S. Cl.
CPC ............ *H01G 5/16* (2013.01); *H01H 59/0009* (2013.01); *H01L 28/40* (2013.01); *H01L 29/66181* (2013.01); *H01L 29/92* (2013.01)

(58) Field of Classification Search
CPC .... H01G 5/16; H01L 28/40; H01L 29/66181; H01L 29/92
See application file for complete search history.

(56) References Cited

U.S. PATENT DOCUMENTS

| 6,100,477 | A | 8/2000 | Randall et al. | |
| 6,791,441 | B2 * | 9/2004 | Pillans | B81B 3/0008 |
| | | | | 335/78 |
| 6,803,534 | B1 * | 10/2004 | Chen | B81B 3/0008 |
| | | | | 200/181 |
| 7,474,171 | B2 * | 1/2009 | Morris | B81B 3/0086 |
| | | | | 257/600 |
| 2007/0278075 | A1 * | 12/2007 | Terano | H01P 1/127 |
| | | | | 200/181 |

(Continued)

FOREIGN PATENT DOCUMENTS

| EP | 1 251 577 A2 | 10/2002 |
| WO | WO 02/12114 A2 | 2/2002 |
| WO | WO 2006/007042 A2 | 1/2006 |

OTHER PUBLICATIONS

Written Opinion of the international Searching Authority for International Application No. PCT/US2015/032498, filed May 26, 2015, Written Opinion of the International Searching Authority mailed Sep. 17, 2015 (8 pgs.).

(Continued)

*Primary Examiner* — Joseph C Nicely
(74) *Attorney, Agent, or Firm* — Lewis Roca Rothgerber Christie LLP

(57) ABSTRACT

A switchable capacitor including a first electrode, a dielectric layer on the first electrode, a second electrode configured to be suspended in an undeflected position over the dielectric layer in a de-activated state, and to deflect toward the first electrode in an activated state in response to a voltage difference between the two electrodes, a gap between the second electrode and the dielectric layer in the activated state being less than a corresponding gap in the de-activated state, and a capacitor having a first and second end, coupled to one of the electrodes at the first end, and configured to reduce the voltage difference between the electrodes as the second electrode deflects toward the first electrode in the activated state, wherein the voltage difference between the electrodes corresponds to a bias voltage applied across the second end of the capacitor and an other one of the first and second electrodes.

18 Claims, 3 Drawing Sheets

(56) References Cited

U.S. PATENT DOCUMENTS

| | | | |
|---|---|---|---|
| 2011/0259717 A1* | 10/2011 | Pillans | H01H 57/00 |
| | | | 200/181 |
| 2013/0299328 A1 | 11/2013 | Malczewski et al. | |
| 2014/0011697 A1* | 1/2014 | Vasan | G01N 27/22 |
| | | | 506/9 |
| 2014/0028113 A1* | 1/2014 | Morris | H01G 5/18 |
| | | | 307/109 |

OTHER PUBLICATIONS

International Search Report for International Application No. PCT/US2015/032498, filed May 26, 2015, International Search Report dated Sep. 9, 2015 and mailed Sep. 17, 2015 (5 pgs.).

* cited by examiner

INTEGRATED CAPACITIVELY-COUPLED BIAS CIRCUIT FOR RF MEMS SWITCHES

FIELD

Embodiments of the invention relate to switchable capacitors, and more particularly, to switchable capacitors utilized to selectively couple or decouple a microwave signal between an input portion and an output portion of a microwave transmission line.

BACKGROUND

It is sometimes desirable to provide a switch between an input portion and an output portion of a microwave transmission line. One device for performing such a function is a radio frequency (RF) micro-electro-mechanical system (MEMS) switch. One example is the switchable capacitor disclosed in the U.S. patent application entitled "Switchable Capacitor" (U.S. application Ser. No. 13/556,273), filed on Jul. 24, 2012, the entire content of which is incorporated herein by reference. The RF MEMS switch typically has a substrate with two conductive posts spaced apart on the substrate. The switch includes a switchable capacitor having a conductive part (e.g., a bottom electrode of the switchable capacitor) on the substrate disposed between, but electrically separated from, the bottom portions of the posts. The bottom electrode is covered by a layer of a solid dielectric material. A flexible (e.g., elastic), electrically conductive membrane (e.g., the upper electrode of the switchable capacitor) extends between, and has ends thereof electrically connected to, the tops of the posts, so that a central portion of the flexible, electrically conductive membrane is suspended above the bottom electrode. An input portion of a microwave transmission line is coupled to an end of one of the top and bottom electrodes and an output portion of the transmission line is coupled to the other end of the one of the top and bottom electrodes. In some examples, the input portion of a microwave transmission line may be coupled to one of the top and bottom electrodes and an output portion of the transmission line may be coupled to the other one of the top and bottom electrodes.

The switch includes a switchable voltage source, coupled between the top and bottom electrode for producing a switchable electrostatic force between the two electrodes. The switchable electrostatic force changes the spacing between the two electrodes, and hence switches (e.g., modifies) the capacitance of the switch, selectively in accordance with a voltage produced by the switchable bias voltage source. The actuation of the switch from a low capacitance state (e.g., open state) to a high capacitance state (e.g., closed state) is prompted by a pull down voltage, which produces sufficient attractive electrostatic force to bring the top and bottom electrodes closer to one another.

In some applications, such as high power applications, it is desirable to have a high pull down voltage on the top, flexible electrode because if the pull down voltage is too low, the RF signal can itself activate the switch, which is an undesired effect. If the pull down voltage on a conventional RF MEMS switch is increased, this will increase the electric field strength in the solid dielectric when the MEMS switch is closed (i.e., in the activated state). This can result in solid dielectric breakdown or excessive charging of the solid dielectric which can lead to "stiction" of the second, flexible electrode which can cause the flexible membrane to remain in the down or closed position in the deactivated state.

What is desired is a bias scheme that reduces the electric field strength experienced by the dielectric, thus improving (e.g., increasing) the durability of the RF MEMS switch, without affecting its actuation responsiveness.

SUMMARY

Aspects of embodiments of the invention are directed toward improving the durability (e.g., increasing the mean time to failure) of the radio frequency (RF) micro-electro-mechanical system (MEMS) switch by reducing the electric field strength experienced by the dielectric of the switch during an activated state (e.g., actuated state).

Aspects of embodiments of the invention are directed to an integrated capacitively coupled bias circuit for activating/deactivating a RF MEMS switch having a pair of electrodes spaced apart from one another, where the circuit is configured to reduce a voltage across electrode pairs as the electrodes approach one another during an activation phase.

According to an embodiment of the invention, there is provided a switchable capacitor, including: a first electrode; a dielectric layer on the first electrode; a second electrode configured to be suspended in an undeflected position over the dielectric layer in a de-activated state, and to deflect toward the first electrode in an activated state in response to a voltage difference between the first and second electrodes, a gap between the second electrode and the dielectric layer in the activated state being less than a corresponding gap in the de-activated state; and a capacitor having a first end and a second end, electrically coupled to one of the first and second electrodes at the first end, and configured to reduce the voltage difference between the first and second electrodes as the second electrode deflects toward the first electrode in the activated state, wherein the voltage difference between the first and second electrodes corresponds to a bias voltage applied across the second end of the capacitor and an other one of the first and second electrodes.

The second electrode may contact the dielectric layer in the activated state, and return to the undeflected position in the de-activated state.

The second electrode may include a flexible membrane configured to bend toward and contact the dielectric layer in the activated state.

The second electrode may include an elastic membrane configured not to deflect beyond its range of elasticity in the activated state.

The capacitor may be configured to reduce the voltage difference between the first and second electrodes as the switchable capacitor transitions from the de-activated state to the activated state while the bias voltage is substantially constant at an on value.

An initial voltage difference between the first and second electrodes may be higher than or about equal to a pull-down voltage applied across the first and second electrodes to transition from the deactivated state to the activated state.

The capacitor may be configured to reduce the voltage difference between the first and second electrodes from the initial voltage difference to a lower voltage in the activated state. The lower voltage may be equal to about 50% of the pull-down voltage.

The initial voltage difference between the first and second electrodes may produce an electrostatic force between the first and second electrodes sufficient to electrostatically drive the switchable capacitor between an activated state and the de-activated state.

A capacitance of the capacitor may be equal to about 50% of an effective capacitance of the switchable capacitor in an activated state.

The first electrode may be configured to transmit a radio frequency (RF) signal.

A bias voltage source may generate the bias voltage, and the bias voltage source may be coupled to the capacitor through a resistor, the resistor being configured to isolate the RF signal from the bias voltage.

According to an embodiment of the present invention, there is provided a switch, including: A first electrode; a dielectric layer on the first electrode; a second electrode configured to be suspended in an undeflected position over the dielectric layer in a de-activated state, and to deflect toward the first electrode in an activated state, a gap between second electrode and the dielectric layer in the activated state being less than a corresponding gap in the de-activated state; a bias voltage source coupled between the first electrode and the second electrode and configured to generate a voltage difference between the first electrode and the second electrode to electrostatically drive the switch between an activated state and the de-activated state; and a capacitor electrically coupled to one of the first and second electrodes and the bias voltage source, and configured to reduce a voltage difference between the first and second electrodes as the second electrode deflects toward the first electrode in the activated state.

The voltage difference between the first and second electrodes may produce a switchable electrostatic force between the first and second electrodes to electrostatically drive the switch between an activated state and the de-activated state.

The second electrode may contact the dielectric layer in the activated state, and return to the undeflected position in the de-activated state.

The capacitor may be configured to reduce the voltage difference between the first and second electrodes from a voltage greater than or about equal to a pull-down voltage to a lower voltage in the activated state.

The capacitor may be configured to reduce the voltage difference between the first and second electrodes as the switchable capacitor transitions from the de-activated state to the activated state, while an output voltage of the bias voltage source is substantially constant at an on value.

According to an embodiment of the present invention, there is provided a switching system, including: a substrate; a microwave transmission line having an input portion and an output portion and configured to transmit microwave energy; a switchable capacitor on the substrate and coupled between the input and output portions of the microwave transmission line, the switchable capacitor including: a first electrode coupled to the input and output portions of the microwave transmission line; a dielectric layer on the first electrode; a second electrode configured to be suspended in an undeflected position over the dielectric layer in a de-activated state, and to deflect toward the first electrode in an activated state in response to a voltage difference between the first and second electrodes, a gap between the second electrode and the dielectric layer in the activated state being less than a corresponding gap in the de-activated state; and a capacitor electrically coupled to one of the first and second electrodes and configured to reduce the voltage difference between the first and second electrodes as the second electrode deflects toward the first electrode in the activated state; and a bias voltage source coupled to the switchable capacitor and configured to generate the voltage difference between the first and second electrodes to electrostatically drive the switch between an activated state and the de-activated state, wherein in the activated state, the microwave energy on the input portion is coupled to the output portion through the switchable capacitor, and wherein in the de-activated state, the microwave energy on the input portion is de-coupled from the output portion by the switchable capacitor.

BRIEF DESCRIPTION OF THE DRAWINGS

These and other features and advantages of the invention will be better understood by reference to the following detailed description when considered in conjunction with the following drawings, in which like elements are referenced with like numerals. These drawings should not be construed as limiting the invention, but are intended to be illustrative only.

DETAILED DESCRIPTION

The detailed description set forth below in connection with the appended drawings is intended as a description of illustrative embodiments of a system and method for manufacture of a MEMS switch in accordance with the invention, and is not intended to represent the only forms in which the invention may be implemented or utilized. The description sets forth the features of the invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features. The terms "substantially," "about," and similar terms are used as terms of approximation and not as terms of degree, and are intended to account for the inherent deviations in measured or calculated values that would be recognized by those of ordinary skill in the art. Furthermore, as used herein, when a component is referred to as being "on" another component, it can be directly on the other component or components may also be present therebetween. Moreover, when a component is referred to as being "coupled" to or "connected" to another component, it can be directly attached to the other component or intervening components may be present therebetween.

The invention relates to a switchable capacitor (e.g., a radio frequency (RF) micro-electro-mechanical system (MEMS) switch) with an integrated capacitively coupled bias circuit for selective coupling or decoupling of a microwave signal between an input portion and an output portion of a microwave transmission line.

According to an embodiment of the invention, the integrated capacitively coupled bias circuit controls (e.g., reduces) a voltage difference between the pair of electrodes of the switch as the electrodes approach each other during an activation phase to couple the microwave signal between the input and output portions. In an embodiment, the decrease in the voltage difference reduces the possibility of (e.g., prevents) the breakdown of the dielectric layer of the RF MEMS switch and/or reduces the occurrence of stiction, thus increasing the mean time to failure of the switch.

Figure 1:
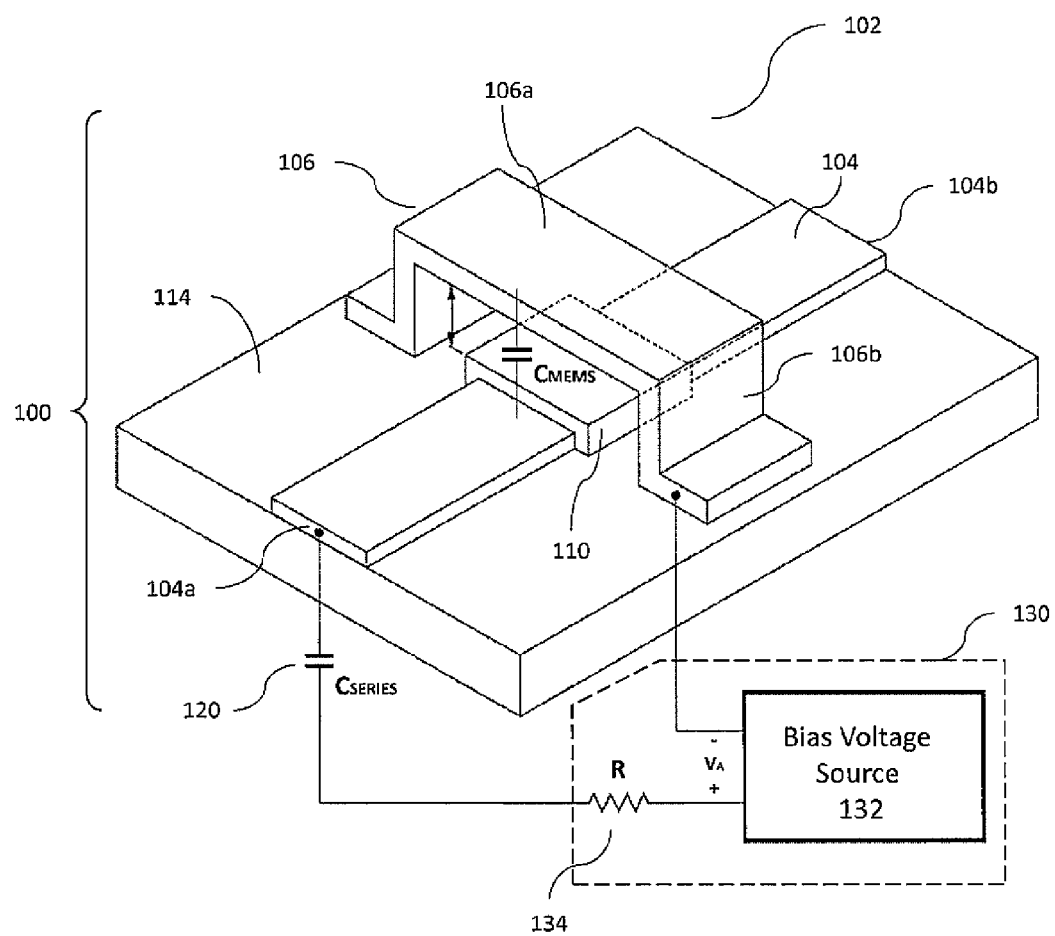
FIG. 1 is a perspective view of a microwave switching system including a microwave switch and a switchable bias voltage source, according to an illustrative embodiment of the invention.

FIG. 1 is a perspective view of a microwave switching system including a microwave switch and a switchable bias voltage source, according to an illustrative embodiment of the invention.

According to an embodiment of the invention, a switching system includes a microwave switch (e.g., a switchable capacitor) 100 and a switch driver 130 for electrically driving (e.g., switching) the microwave switch 100. The microwave switch 100 includes a RF MEMS switch 102 and a capacitor (e.g., series capacitor) 120 coupled to (e.g., in series with) the RF MEMS switch 102. The switch driver 130 includes a bias voltage source (e.g., a switchable voltage source) 132 and an impedance (e.g., a resistor) 134 coupled to (e.g., in series with) the microwave switch 100. In an example, the bias voltage source 132 is coupled through the resistor 134 and capacitor 120 between the first and second electrodes 104 and 106.

In an embodiment, the RF MEMS switch 102 includes a pair of conductive electrodes, the first electrode (e.g., the bottom electrode) 104, and the second electrode (e.g., the top electrode) 106, a dielectric layer 110 formed on the first electrode 104 and between the electrode pair, and an insulating substrate on which the two electrodes are formed. The dielectric layer may include silicon nitride, silicon dioxide, hafnium oxide, Barium zirconium titanate (BZT), and/or the like. The flexible (e.g., bendable or elastic) membrane 106a, which comprises the top portion of the second electrode 106, is suspended (e.g., in an undeflected, minimum stress, rest position) above the dielectric layer 110 by two posts (e.g., vertically extending posts) 106b forming a gap over the dielectric layer 110. The two electrodes 104 and 106 and the dielectric layer 110 form a capacitance, which is symbolically illustrated as $C_{MEMS}$ in FIG. 1.

In an example, the flexible membrane (e.g., elastic membrane) 106a is made of a conductive material, such as aluminum, and has a thickness from about 0.1 µm to about 1 µm; the dielectric layer 110 includes silicon nitride, silicon dioxide, hafnium oxide, Barium zirconium titanate (BZT), and/or the like, and has a thickness from about 0.1 µm to about 0.5 µm; and first electrode 104 is made of a conductive material, such as gold or an alloy of tungsten and titanium (e.g., TiW, which is an alloy of 90% tungsten (W) and 10% Titanium(Ti)), and has a thickness from about 0.1 µm to about 1 µm.

According to embodiments of the invention, either of the first and second electrodes 104 and 106 may function as a transmission line for transmission of microwave energy (e.g., an RF signal). However, for illustration purposes, it is hereinafter assumed that the first electrode 104 acts as the microwave transmission line. An RF signal may be applied to the input portion 104a and may be coupled (e.g., directly coupled) through the RF MEMS switch 102 to an output portion 104b of the transmission line.

According to an embodiment, the bias voltage source 132 is a switchable bias voltage source 132 coupled between the first and second electrodes 104 and 106, through a resistor 134 and a capacitor 120. The switchable voltage source 132 may output a voltage $V_A$ that is either a positive or negative direct current (DC) voltage or an alternating current (AC) voltage. In an embodiment, the switchable voltage source (e.g., pulsed voltage source) 132 switches between zero and a positive voltage at its output to thereby produce a switchable electrostatic force between the first and second electrodes 104 and 106 to electrostatically drive the microwave switch 100 (e.g., RF MEMS switch 102) back and forth between the activated and deactivated states. For example, when the bias voltage source 132 applies a positive potential $V_A$ across the electrode pair of the RF MEMS switch 102, the microwave switch 100 enters an activated state (e.g., an actuated state), and when the bias source voltage 132 applies a voltage that is less than a hold voltage (e.g., ⅓ to ½ of the pull down voltage), the microwave switch 100 enters a de-activated state (e.g., a de-actuated state). The hold voltage is defined as the minimum voltage necessary to maintain the RF MEMS switch 102 in the activated state. In some embodiments, the pull-down voltage may be about 15 V to about 40 V, while the hold voltage may be about 5 V to about 20 V. In an example, the pull down time of the microwave switch 100 may be about one microsecond while the release time may be one to several microseconds.

Figure 2A:
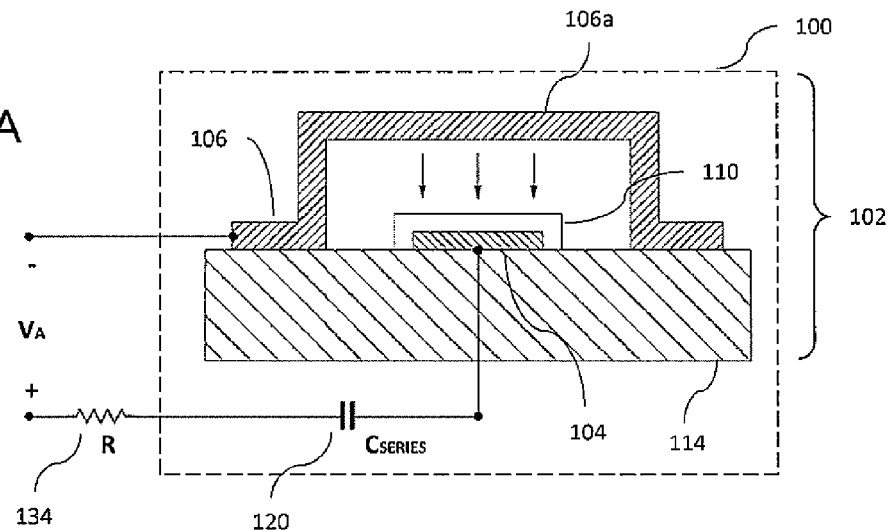
FIGS. 2A-2C are cross-sectional views of the microwave switch of FIG. 1 in de-activated and activated states, respectively, according to illustrative embodiments of the invention.
Figure 2B:
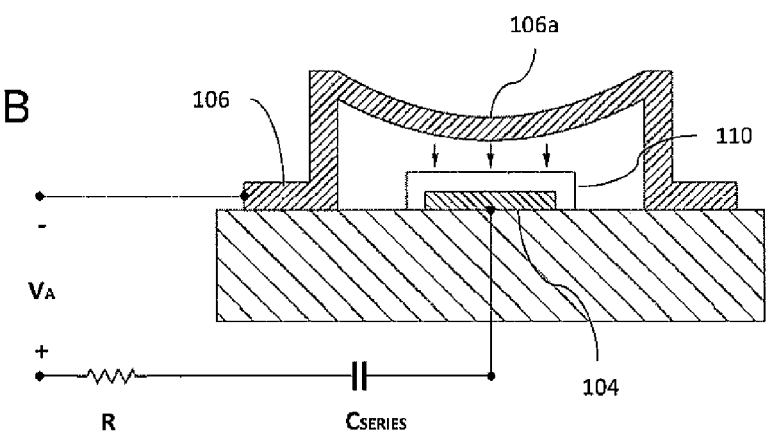
Figure 2C:
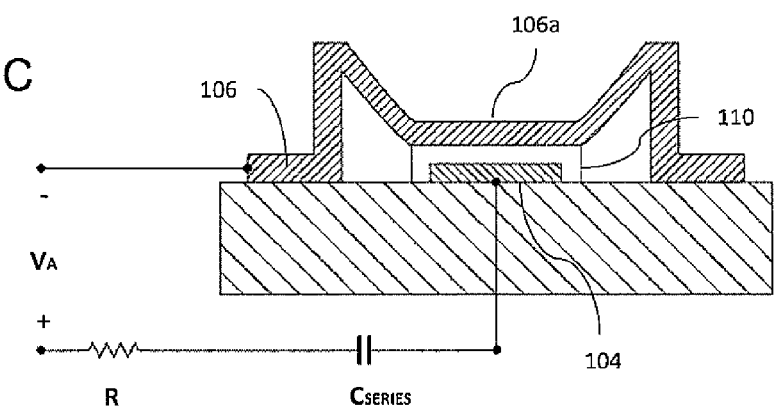

FIGS. 2A-2C are cross-sectional views of the microwave switch 100 of FIG. 1 progressing from a de-activated state to an activated state, according to illustrative embodiments of the invention.

According to an embodiment, to activate (e.g., actuate) the RF MEMS switch 102, the bias voltage source 132 generates a voltage difference between the first and second electrodes 104 and 106. The voltage difference produces electrostatic charges on the electrode pair, which cause the first and second electrodes 104 and 106 be electrostatically attracted to each other. Once the voltage difference across the electrodes 104 and 106 exceeds a threshold (e.g., a pull-in voltage), the attractive force causes the central portion of the second electrode 106 (e.g., the flexible membrane 106a) to move (e.g., to deflect or bend) downward toward the first electrode 104 (as shown in FIG. 2B) and, for example, touch the top of the dielectric layer 110 (as shown in FIG. 2C). In an example, the deflection of the flexible membrane 106a is within the elastic range of the membrane.

When the flexible membrane 106a is deflected toward, and makes contact with, the dielectric material 110 (as shown in FIG. 2C), the contact area may range from 10×10 (µm)² to greater than 500×500 (µm)² (e.g., may be 100×100 (µm)²). In an example, the deflection of the flexible membrane 106a, even when making contact with the dielectric material 110, is within the elastic range of the membrane 106a.

In an embodiment, to de-activate (e.g., de-actuate) the switch, the DC bias voltage across the electrode pair is reduced to below a hold voltage (e.g., a minimum voltage necessary to maintain the deflection of the flexible membrane in the activation state). Once the voltage difference drops below the hold voltage, the inherent resilience of the second electrode 106 returns the flexible membrane 106a to its original suspended position (e.g., an undeflected, minimum stress, rest position), which represents the de-activated state of the switch (as shown in FIG. 2A).

In the de-activated state, the spacing between the first electrode 104 and second electrode 106 (e.g., the flexible membrane 106a) is greater than in the activated state and, thus, the capacitive coupling between the first and second electrodes 104 and 106 is lower (e.g., significantly lower) in the de-activated state than in the activated state. As a result, the RF signal traveling through one of the first and second electrodes 104 and 106 (e.g., the first electrode 104) experiences little or no capacitive coupling to the other one of the first and second electrodes 104 and 106 (e.g., electrode 106), which, for example, may be at a RF ground. For example, in the de-activated state, all or nearly all of the microwave energy at the input portion 104a is transmitted through the first electrode 104 to the output portion 104b.

Conversely, in the activated state, the spacing between the first electrode 104 and second electrode 106 (e.g., the flexible membrane 106a) is less than in the de-activated state. Therefore, in the activated state, the capacitive coupling between the first and second electrodes 104 and 106 is significantly larger than in the de-activated state. Consequently, in the activated state, the RF signal originally traveling through one of the first and second electrodes 104 and 106 (e.g., from the input portion 104a to the output portion 104b of the first electrode 104) is capacitively coupled (e.g., substantially coupled) to the other one of the first and second electrodes 104 and 106 (e.g., the second electrode 106). For example, in an embodiment in which the second electrode 106 is coupled to a reference voltage, such as ground voltage, all or part of the microwave energy at the input portion 104a may be passed to the second electrode 106 (e.g., passed to ground through the grounded second electrode 106) and little to no amount of the microwave energy at the input portion 104a may appear at the output portion 104b.

According to an embodiment, as the flexible membrane (e.g., the elastic membrane) 106a approaches the first electrode 104 and the RF MEMS switch 102 transitions from a low capacitance state (e.g., open state or de-activated state) to a high capacitance state (e.g., closed state or activated state), less voltage is required to maintain the flexible membrane in its deflected position. Thus, the voltage required to hold the RF MEMS switch 102 in its closed state is less than (e.g., significantly less than) the actuating voltage (e.g., pull-in voltage). For example, the hold voltage may be about 5 V to about 20 V, while the actuating voltage may be about 15 V to about 40 V.

In certain applications, such as high power applications, it may be desirable to have a high pull down voltage on the second electrode 106 (e.g., the flexible membrane 106a), because if the pull down voltage is too low, the microwave signal can itself activate the RF MEMS switch 102, which is an undesirable effect. For example, the high pull-down voltage may be between about 50 V to about 80 V. Without the capacitor 120, if the pull down voltage on RF MEMS switch 102 is increased, the electric field strength in the dielectric layer 110 increases when the switch 102 is closed (i.e., is in the activated state). This may result in solid dielectric breakdown or excessive charging of the solid dielectric which may lead to "stiction" of the second electrode 106, which may cause the flexible membrane 106a to remain in the down or closed position even in the deactivated state. Further, while in a RF MEMS circuit not utilizing the capacitor 120, the bias voltage for switching the RF MEMS to the closed state is applied through resistors (e.g., lumped together as resistor 134) to isolate the bias circuitry from the RF circuitry, the resulting bias on the RF MEMS switch 102 in the closed condition after a charging time is the full voltage required to pull the switch to the closed condition. This high voltage may result in decreased mean-time-to failure, which may, for example, be between about 1 minute to several days.

According to an embodiment of the invention, the microwave switch 100 utilizes a capacitor (e.g., fixed capacitor) 120 in series with one or more resistors (hereinafter, referred to as resistor 134) to apply bias to the RF MEMS switch 102. The resistor 134 serves to isolate the bias circuitry from the RF circuitry. After several time constants, as determined by the capacitors and resistors in the bias circuitry (e.g., bias voltage source 132), the applied voltage is divided between the capacitor 120 and the MEMS switch capacitor according to the following expression:

$$V_{MEMS} = C_{series}/(C_{series} + C_{MEMS}) * V_{Applied} \quad (1)$$

where $C_{series}$ is the capacitance of the bias circuit capacitance, $C_{MEMS}$ is the capacitance of the RF MEMS switch 102, $V_{Applied}$ is the magnitude of the bias voltage (e.g., DC bias voltage) applied by the bias voltage source 132 and $V_{MEMS}$ is the bias voltage (e.g., DC bias) between the first and second electrodes 104 and 106 of the RF MEMS switch 102.

In the deactivated state, in which the flexible membrane (e.g., elastic membrane) 106a of the RF MEMS switch 102 is in the up or suspended position, the gap between the flexible membrane 106a and the dielectric layer 110 is at its maximum value (e.g., maximum operational value), and $C_{MEMS}$ may be at its minimum value. Therefore, $V_{MEMS}$ is at its maximum value, for a given $V_{Applied}$. However, as the flexible membrane 106a deflects toward the dielectric layer 110 in the activation state, the separation between the electrodes is reduced (e.g., minimized) and the $C_{MEMS}$ increases, leading to a reduction in $V_{MEMS}$ and the resulting electric field strength in the dielectric layer 110. Thus, by gradually decreasing the voltage across the RF MEMS switch 102 during the activation phase, the series capacitance 120 reduces the probability of (e.g., prevents) the occurrence of a dielectric breakdown and/or stiction, and increases the mean-time-to failure of the MEMS device.

Figure 3:
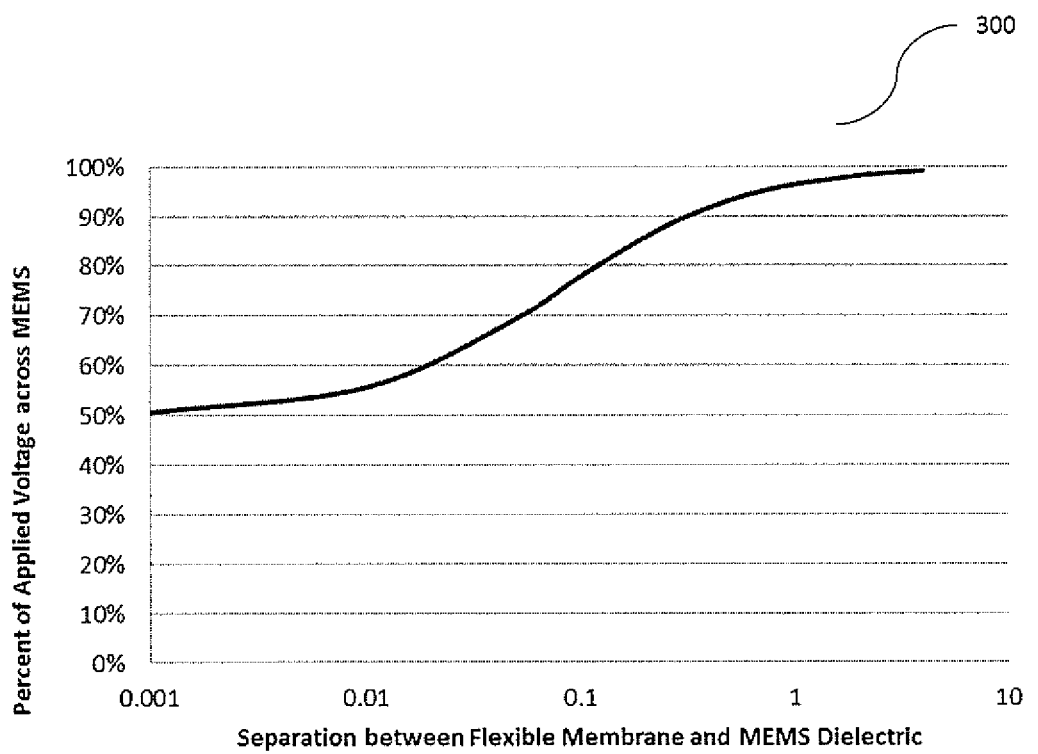
FIG. 3 is a graph illustrating the change in voltage across the RF MEMS switch as the switch closes while transitioning from/to a de-activated state to/from an activated state, according to an illustrative embodiment of the invention.

FIG. 3 is a graph 300 illustrating the change in voltage across the RF MEMS switch as the switch closes while transitioning from/to a de-activated state to/from an activated state, according to an illustrative embodiment of the invention. The horizontal axis represents the gap (e.g., separation) between the flexible membrane 106a and the top surface of the dielectric layer 110, and the vertical axis represents the voltage across the first and second electrodes 104 and 106 of the RF MEMS switch as a percentage of the applied voltage of the bias voltage source 132.

According to an embodiment, the capacitance $C_{MEMS}$ of the RF MEMS switch 102 is, for example, about 50 fF in an unbiased state (e.g., deactivated state), and is, for example, about 1 pF in the biased or contact state (e.g., activated state) for a ratio of high to low capacitance of about 20. The capacitance $C_{MEMS}$ may depend on, for example, the material of the dielectric layer 110, the thickness of the dielectric layer 110, and the area of the top membrane 106a. For example, $C_{MEMS}$ in the deactivated state may be from about 0.1 pF to about 50 pF, and $C_{MEMS}$ in the activated state may be from about 10 fF to about 200 fF. In an embodiment, the capacitance $C_{series}$ is approximately equal to the capacitance of the RF MEMS switch 102 in the high capacitance state or closed state, and is, for example, 1 pF.

In an example in which $C_{MEMS}$ is about 50 fF in a deactivated state and is about 1 pF in the activated state, and $C_{series}$ is approximately equal to $C_{MEMS}$ in an activated state, when the switch is in the low capacitance state and the bias voltage is first applied, the voltage between the first and second electrodes 104 and 106 of the RF MEMS switch 102 is about 95% of the applied voltage $V_{Applied}$. When $V_{Applied}$ is adjusted to a value slightly higher than the pull-down voltage (e.g., when $0.95*V_{Applied}$>pull-in voltage) of the RF MEMS switch 102, the switch starts to close (e.g., becomes activated). As the flexible membrane 106a moves downward toward the dielectric layer 110, the gap (e.g., spacing) between the two decreases and, as a result, $C_{MEMS}$ gradually increases and $V_{MEMS}$ gradually decreases. When the RF MEMS switch 102 is fully closed (e.g., fully closed or at the point of contact), the voltage across the RF MEMS switch 102 is reduced to approximately ½ of the applied voltage $V_{Applied}$. So long as $V_{Applied}$ is selected such that ½ of $V_{Applied}$ is greater or equal to the hold voltage of the RF MEMS switch 102 (e.g., the minimum voltage required to maintain the flexible membrane 106a in its bent or activated position), the RF MEMS switch 102 will stably remain activated.

Thus, utilizing the series capacitance 120 results in a reduction (e.g., significant reduction) in the voltage across the first and second electrodes 104 and 106 while in the switch 102 is activated, which lessens the probability of a voltage breakdown or stiction and increases (e.g., substantially increases) the mean-time-to-failure of the MEMS device.

Additionally, notwithstanding the reduction in voltage across the RF MEMS switch 102 as the flexible membrane (e.g., the elastic membrane) 106a moves toward the first electrode (e.g., bottom electrode) 104, the electric field continues to increase, assuring that the electrostatic force will continue to drive the flexible membrane 106a toward the first electrode 104. Further, according to an embodiment, the automatic change in the MEMS voltage with the movable membrane position is independent of any variation in the DC bias resulting from modifying the DC bias pulse of the bias voltage source 132 and, thereby, improves the simplicity of the DC bias voltage source 132 circuitry.

According to an embodiment, the integration of the series capacitor 120 with the microwave switch 100 and the DC bias circuitry 130 may be implemented without any additional steps in the RF MEMS process, as current RF MEMS fabrication process allows for the fabrication of capacitors of the range discussed above as part of the RF MEMS integrated circuit.

According to an embodiment of the invention, a single series capacitor 120 may be utilized in conjunction with multiple MEMS switches. The size of the series capacitor 120 may be adjusted (e.g., increased) to account for the increase in the equivalent capacitance of the multiple MEMS switches. In such an embodiment, however, the maximum voltage across one or more of the MEMS switches may be instantaneously higher than desired due to possible mismatches in the activation time of the multiple MEMS switches (e.g., mismatches in the time it takes for each of flexible membranes to reach a closed state). According to another embodiment, each of the many MEMS switches may have a separate corresponding series capacitor in their bias line. Such a configuration may resolve the voltage spike resulting from employing a single shared series capacitor.

It will be understood by a person of ordinary skill in the art that the teachings above do not only apply to the RF MEMS switch illustrated in FIGS. 1 and 2A-2C, but also apply to any other switch configuration in which an adjustable capacitance is formed between a pair of electrodes that deflect toward one another in response to a control bias signal.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A switchable capacitor, comprising:
a first electrode;
a dielectric layer on the first electrode;
a second electrode configured to be suspended in an undeflected position over the dielectric layer in a de-activated state, and to deflect toward the first electrode in an activated state in response to a voltage difference between the first and second electrodes, a gap between the second electrode and the dielectric layer in the activated state being less than a corresponding gap in the de-activated state; and
a capacitor having a first end and a second end, electrically coupled to one of the first and second electrodes at the first end, and configured to reduce the voltage difference between the first and second electrodes as the second electrode deflects toward the first electrode in the activated state,
wherein the voltage difference between the first and second electrodes corresponds to a bias voltage applied across the second end of the capacitor and an other one of the first and second electrodes.

2. The switchable capacitor of claim 1, wherein the second electrode contacts the dielectric layer in the activated state, and returns to the undeflected position in the de-activated state.

3. The switchable capacitor of claim 1, wherein the second electrode comprises a flexible membrane configured to bend toward and contact the dielectric layer in the activated state.

4. The switchable capacitor of claim 1, wherein the second electrode comprises an elastic membrane configured not to deflect beyond its range of elasticity in the activated state.

5. The switchable capacitor of claim 1, wherein the capacitor is configured to reduce the voltage difference between the first and second electrodes as the switchable capacitor transitions from the de-activated state to the activated state while the bias voltage is substantially constant at an on value.

6. The switchable capacitor of claim 1, wherein an initial voltage difference between the first and second electrodes is higher than or about equal to a pull-down voltage applied across the first and second electrodes to transition from the de-activated state to the activated state.

7. The switchable capacitor of claim 6, wherein the capacitor is configured to reduce the voltage difference between the first and second electrodes from the initial voltage difference to a lower voltage in the activated state.

8. The switchable capacitor of claim 7, wherein the lower voltage is equal to about 50% of the pull-down voltage.

9. The switchable capacitor of claim 7, wherein the initial voltage difference between the first and second electrodes produces an electrostatic force between the first and second electrodes sufficient to electrostatically drive the switchable capacitor between the activated state and the de-activated state.

10. The switchable capacitor of claim 1, wherein a capacitance of the capacitor is substantially the same as an effective capacitance between the first and second electrodes in the activated state.

11. The switchable capacitor of claim 1, wherein the first electrode is configured to transmit a radio frequency (RF) signal.

12. The switchable capacitor of claim 11,
wherein a bias voltage source generates the bias voltage, and
wherein the bias voltage source is coupled to the capacitor through a resistor, the resistor being configured to isolate the RF signal from the bias voltage.

13. A switch, comprising:
A first electrode;
a dielectric layer on the first electrode;
a second electrode configured to be suspended in an undeflected position over the dielectric layer in a de-activated state, and to deflect toward the first electrode in an activated state, a gap between second electrode and the dielectric layer in the activated state being less than a corresponding gap in the de-activated state;
a bias voltage source coupled between the first electrode and the second electrode and configured to generate a voltage difference between the first electrode and the second electrode to electrostatically drive the switch between an activated state and the de-activated state; and a capacitor electrically coupled to one of the first and second electrodes and the bias voltage source, and configured to reduce a voltage difference between the first and second electrodes as the second electrode deflects toward the first electrode in the activated state.

14. The switch of claim 13, wherein the voltage difference between the first and second electrodes produces a switchable electrostatic force between the first and second electrodes to electrostatically drive the switch between the activated state and the de-activated state.

15. The switch of claim 13, wherein the second electrode contacts the dielectric layer in the activated state, and returns to the undeflected position in the de-activated state.

16. The switch of claim 13, wherein the capacitor is configured to reduce the voltage difference between the first and second electrodes from a voltage greater than or about equal to a pull-down voltage to a lower voltage in the activated state.

17. The switch of claim 13, wherein the capacitor is configured to reduce the voltage difference between the first and second electrodes as the switchable capacitor transitions from the de-activated state to the activated state, while an output voltage of the bias voltage source is substantially constant at an on value.

18. A switching system, comprising:
a substrate;
a microwave transmission line having an input portion and an output portion and configured to transmit microwave energy;
a switchable capacitor on the substrate and coupled between the input and output portions of the microwave transmission line, the switchable capacitor comprising:
 a first electrode coupled to the input and output portions of the microwave transmission line;
 a dielectric layer on the first electrode;
 a second electrode configured to be suspended in an undeflected position over the dielectric layer in a de-activated state, and to deflect toward the first electrode in an activated state in response to a voltage difference between the first and second electrodes, a gap between the second electrode and the dielectric layer in the activated state being less than a corresponding gap in the de-activated state; and
 a capacitor electrically coupled to one of the first and second electrodes and configured to reduce the voltage difference between the first and second electrodes as the second electrode deflects toward the first electrode in the activated state; and
a bias voltage source coupled to the switchable capacitor and configured to generate the voltage difference between the first and second electrodes to electrostatically drive the switch between the activated state and the de-activated state,
wherein in the activated state, the microwave energy on the input portion is coupled to the output portion through the switchable capacitor, and
wherein in the de-activated state, the microwave energy on the input portion is de-coupled from the output portion by the switchable capacitor.

* * * * *